(12) United States Patent
Nakamura et al.

(10) Patent No.: US 6,342,748 B1
(45) Date of Patent: Jan. 29, 2002

(54) SURFACE ACOUSTIC WAVE DEVICE, SUBSTRATE THEREFOR AND METHOD OF MANUFACTURING THE SUBSTRATE

(75) Inventors: Yukinori Nakamura, Nagoya; Tomohiko Shibata, Kasugai, both of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/431,398

(22) Filed: Nov. 1, 1999

(30) Foreign Application Priority Data

| Nov. 2, 1998 | (JP) | ............................................ 10-312316 |
| Nov. 4, 1998 | (JP) | ............................................ 10-312892 |
| Feb. 5, 1999 | (JP) | ............................................ 11-028538 |

(51) Int. Cl.$^7$ .............................................. H01L 41/08
(52) U.S. Cl. .................................................. 310/313 A
(58) Field of Search .......................... 310/313 A, 313 R, 310/360

(56) References Cited

U.S. PATENT DOCUMENTS

| 5,278,435 A | * | 1/1994 | Van Hove et al. | ............. 257/184 |
| 5,598,014 A | * | 1/1997 | Barany et al. | ............... 257/189 |
| 5,650,198 A | * | 7/1997 | Denbaars et al. | ......... 427/255.2 |
| 5,733,796 A | * | 3/1998 | Manabe et al. | .............. 437/127 |
| 6,045,626 A | * | 4/2000 | Yano et al. | ................... 148/334 |
| 6,051,849 A | * | 4/2000 | Davis et al. | ................. 257/103 |

FOREIGN PATENT DOCUMENTS

EP         0 833 446 A2         4/1998

OTHER PUBLICATIONS

Patent Abstracts of Japan, vol. 1998, No. 04, Mar. 31, 1998 & JP 09 312546 A (Kyocera Corp, Dec. 2, 1997 *abstract*.

Patent Abstracts of Japan, vol. 017, No. 160 (E–1342), Mar. 29, 1993 & JP 04 323880 A (Asahi Chem Ind Co Ltd), Nov. 13, 1992 *abstract*.

Patent Abstracts of Japan, vol. 017, No. 466 (E–1421), Aug. 25, 1993 & JP 05 110139 A (Nichia Chem Ind Ltd), Apr. 30, 1993 *abstract*.

Keller, S. et al., "Influence of Sapphire Nitridation on Propertiesof Gallium Nitride Grown by Metalorganic Chemical Vapor Deposition," Applied PHysics Letters, US, American Institute of Physics, NY, vol. 68, No. 11, Mar. 11, 1996, pp 1525–1527.

* cited by examiner

*Primary Examiner*—Mark O. Budd
(74) *Attorney, Agent, or Firm*—Burr & Brown

(57) ABSTRACT

A sapphire single crystal wafer 11 having a diameter not less than two inches and having an off-angled surface which is obtained by rotating an R (1-102) surface about an axis in a negative direction by a given off-angle not less than 2° is introduced in a CVD apparatus. While the sapphire substrate is kept at a temperature of about 950° C., a buffer layer made of gallium nitride or aluminum-gallium nitride is first deposited with an average thickness of 0.1–0.2 $\mu$m, and then an aluminum nitride single crystal layer is deposited with an average thickness not less than 2 $\mu$m. The thus obtained aluminum nitride single crystal layer does not have a significant amount of cracks, has an excellent piezoelectric property, and has a high propagating velocity.

19 Claims, 8 Drawing Sheets

FIG. 4
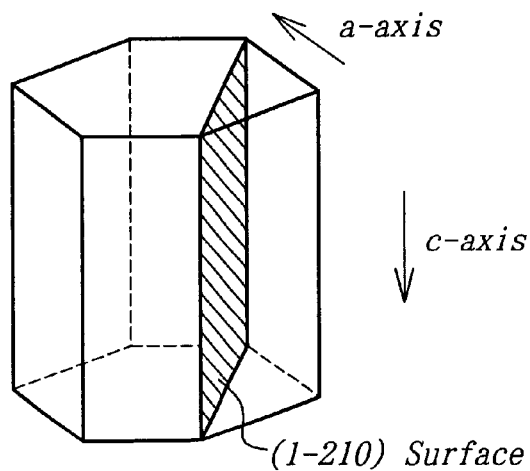
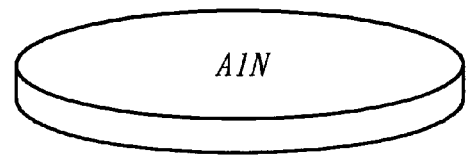
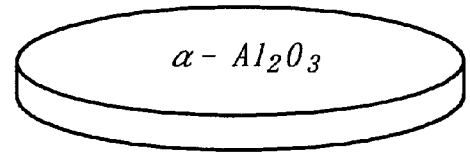
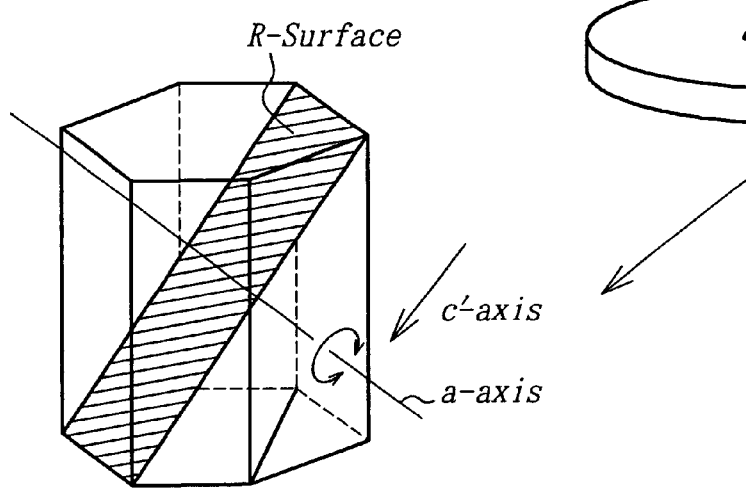

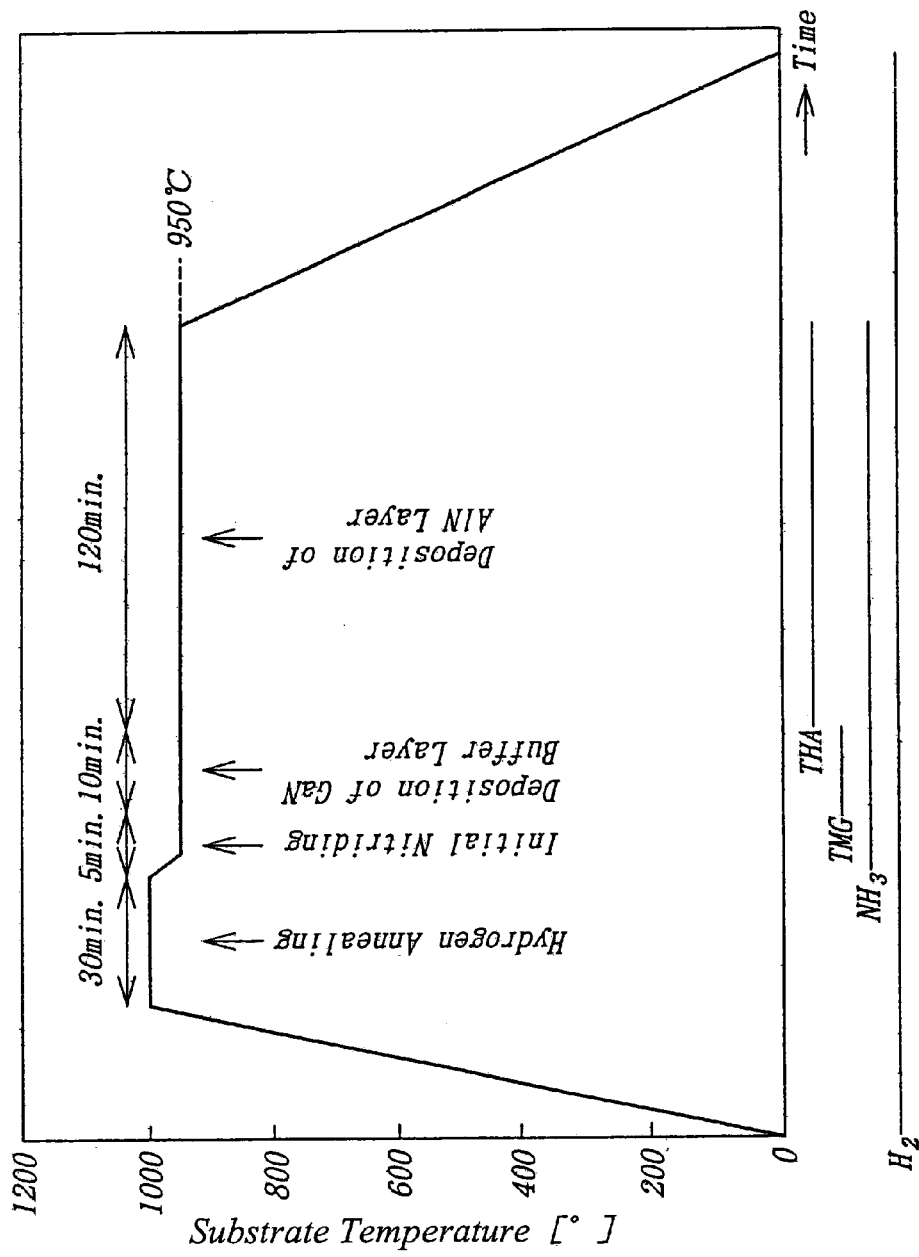

SURFACE ACOUSTIC WAVE DEVICE, SUBSTRATE THEREFOR AND METHOD OF MANUFACTURING THE SUBSTRATE

BACKGROUND OF THE INVENTION

1. Field of the Invention

The present invention relates to a surface acoustic wave device, and a substrate for use in a surface acoustic wave device, and more particularly to a substrate comprising a sapphire single crystal substrate consisting of α-$Al_2O_3$, a buffer layer formed on said sapphire single crystal substrate by metal organic chemical vapor deposition (MOCVD), and an aluminum nitride single crystal layer formed on the buffer layer also by MOCVD. The present invention also relates to a method of manufacturing the above mentioned substrate for use in a surface acoustic wave device.

2. Related Art Statement

Heretofore, substrates of surface acoustic wave devices have been generally made of quartz, $LiNbO_3$, $LiTaO_3$, $Li_2B_4O_7$ and others. These substrate materials have been utilized because they have an excellent electromechanical coupling coefficient $K^2$ and a temperature coefficient of delay time (TCD) which are important transmission properties of the surface acoustic wave device. Due to the wide application of surface acoustic wave devices, there has been a need for a surface acoustic wave device having a very high operation frequency. However, a propagating velocity of the surface acoustic wave in the above mentioned substrate materials is about 3000–5000 m/sec, and in order to realize a surface acoustic wave device having an operation frequency in the order of GHz, it is required to provide a substrate having a propagating velocity for the surface acoustic wave not lower than 5000–6000 m/sec.

As stated above, in order to realize a surface acoustic wave device having a very high operation frequency, it is necessary to use a substrate having a high propagating velocity. For this purpose, it has been proposed to use a substrate including aluminum nitride (AlN). An electromechanical coupling coefficient $K^2$ of the aluminum nitride is about 0.8% which is higher than that of quartz by about five times. A temperature coefficient of delay time TCD of the aluminum nitride is not larger than 20 ppm/° C. However, aluminum nitride has a very high melting point, and therefore it is difficult to obtain a large bulk aluminum nitride single crystal. Due to this fact, in general, an aluminum nitride single crystal layer is formed on a sapphire single crystal substrate made of α-$Al_2O_3$. Such a sapphire single crystal substrate has been used because it is easily available and its lattice constant does not differ largely from that of the aluminum nitride.

As stated above, it has been proposed to use a substrate in which an aluminum nitride layer is deposited on a sapphire substrate. The inventors of the instant application have conducted various experiments, in which after performing an initial nitriding treatment by exposing an R(1-102) surface of a sapphire substrate to an atmosphere of ammonia to form a very thin aluminum nitride single crystal film, an aluminum nitride single crystal layer is deposited on the aluminum nitride single crystal film by metal organic chemical vapor deposition (MOCVD). For instance, a sapphire single crystal substrate was placed in a CVD apparatus, and then trimethylaluminum (TMA) and ammonia ($NH_3$) were introduced into the CVD apparatus to deposit an aluminum nitride single crystal layer on the sapphire substrate. Therefore, it has been confirmed that the aluminum nitride single crystal layer formed by MOCVD has a good electromechanical coupling coefficient $K^2$.

In the experiments, use was made of a very small sapphire substrate of a square shape having a side of 5 mm. In order to manufacture substrates for surface acoustic wave devices on a practically acceptable large scale, it is necessary to use a sapphire wafer not less than two inches (50.8 mm). To this end, it is necessary to establish a method, in which an aluminum nitride single crystal layer is formed on a surface of the two inch sapphire single crystal wafer, then a desired electrode pattern is formed on the aluminum nitride layer, and finally the sapphire single crystal wafer is divided into chips by slicing.

In one of the experiments conducted by the inventors, use was made of a two inch sapphire single crystal wafer having a thickness of 300–500 μm. A first aluminum nitride single crystal film was formed on the sapphire wafer by means of the above mentioned initial nitriding treatment. A second aluminum nitride single crystal layer having a thickness not less than 1 μm was formed on the first aluminum nitride single crystal film by MOCVD. Finally, the sapphire single crystal wafer was divided into a number of surface acoustic wave devices. It was then taken experimentally confirmed that a number of cracks were formed in the aluminum nitride single crystal layer with a mutual spacing of about 1 mm. Surface acoustic wave devices were then manufactured using the cracked substrates. It was then experimentally confirmed that the propagation loss of the surface acoustic wave devices was very large and the property of the device was deteriorated. Therefore, it was experimentally confirmed that practically usable surface acoustic wave devices could not be manufactured using the above mentioned sapphire single crystal substrate.

In a field of manufacturing light emitting semiconductor devices (LED), it has been known to use a substrate including a sapphire single crystal substrate and a III–V compound single crystal layer such as GaN and AlN single crystal layer formed on the sapphire single crystal substrate. In order to prevent cracks from being formed in the III–V compound single crystal layer, it has been proposed to form a thin buffer layer on the sapphire single crystal substrate prior to the formation of the III–V compound single crystal layer. The inventors have introduced this method in the formation of a substrate for surface acoustic wave devices. That is to say, a very thin buffer layer consisting of an aluminum nitride single crystal film having a thickness of about 5–50 nm was first formed on a sapphire single crystal substrate, followed by the formation of a thick aluminum nitride layer on the buffer layer. In this case, during the formation of the buffer layer consisting of the relatively thin first aluminum nitride single crystal layer, a surface temperature of the sapphire substrate was kept to a lower temperature such as 300–450° C. The substrate was then heated to 900–1100° C. during the formation of the relatively thick second aluminum nitride single crystal layer. Consequently, the aluminum nitride layer formed in the manner was free from cracks. However, the electromechanical coupling coefficient $K^2$ become substantially zero and the aluminum nitride single crystal layer lost its piezoelectric property. It is apparent that such a material could never be suitable for use as the substrate for a surface acoustic wave device. In the light emitting semiconductor device, the loss of piezoelectric property is irrelevant, but in a surface acoustic wave device, the piezoelectric property is indispensable. An explanation for the disappearance of the piezoelectric property has yet to be clarified. However, upon observing the microstructure of the surface of aluminum nitride single crystal layer, it was confirmed that many twins were formed in the surface.

The inventors have proposed, in U.S. patent application Ser. No. 08/936,614 (corresponding to EP 0833 446 A2), a substrate for a surface acoustic wave device, in which the formation of cracks can be effectively prevented through the use of a sapphire single crystal wafer having a size not smaller than two inches.

This known substrate comprises a sapphire single crystal substrate made of $\alpha$-$Al_2O_3$ and an aluminum nitride single crystal layer formed on a surface of said sapphire single crystal substrate. The surface of the sapphire single crystal substrate is formed by an off-angled surface which is obtained by rotating an R(1-102) surface about a [11-20] axis by a given off-angle. The aluminum nitride single crystal layer is formed by a buffer layer consisting of an aluminum nitride single crystal film deposited on the off-angled surface of the sapphire single crystal substrate by MOCVD. An aluminum nitride single crystal layer is also deposited on the buffer layer by MOCVD.

In this substrate for a surface acoustic wave device, the first aluminum nitride single crystal layer serving as the buffer layer has a thickness of 5–50 nm, particularly about 10 nm, and the second aluminum nitride single crystal layer has a thickness not less than 1 $\mu$m. Such two-layer structure is formed by controlling a temperature of the sapphire substrate surface, while the wafer is placed in a CVD apparatus. That is to say, when the buffer layer is deposited, the substrate temperature is set to 300–450° C., particularly about 350° C., and when the second aluminum nitride layer is deposited, the substrate temperature is adjusted to 900–1100° C., particularly about 950° C.

However, in practice, it is very difficult to form the first aluminum nitride single crystal layer having a very small average thickness at a relatively low temperature in a reproducible manner. Therefore, a manufacturing yield of such a substrate is low. As a result, a substrate for a surface acoustic wave device having a good property could not be obtained. Therefore, a practical surface acoustic wave device comprising an aluminum nitride single crystal substrate has not been proposed.

SUMMARY OF THE INVENTION

The present invention has for its object to provide a novel and useful substrate for a surface acoustic wave device, which has an excellent property.

It is another object of the invention to provide a method of manufacturing the above mentioned substrate for a surface acoustic wave device in an easy and reliable manner.

According to the invention, a substrate for use in a surface acoustic wave device comprises a sapphire single crystal substrate made of $\alpha$-$Al_2O_3$, having a buffer layer formed thereon. The buffer layer is made of a material selected from the group consisting of gallium nitride and aluminum-gallium nitride. An aluminum nitride single crystal layer is formed on the buffer layer with an average thickness larger than that of the buffer layer.

In a preferable embodiment of the substrate for a surface acoustic wave device according to the invention, the buffer layer is formed on an off-angled surface of the sapphire single crystal substrate obtained by rotating an R(1-102) surface about a [11-20] axis by a given off-angle. In this case, it is particularly preferable that the off-angled surface is formed by rotating the R(1-102) surface about the [11-20] axis by substantially –2°. It has been confirmed that in such a substrate for a surface acoustic wave device, substantially no cracks have been formed.

In preferable embodiments of the surface acoustic wave device, the buffer layer consisting of the aluminum nitride or aluminum-gallium nitride film has an average thickness of about 0.1–0.2 $\mu$m. The aluminum nitride single crystal layer formed on the surface of the buffer layer has an average thickness of about 2 $\mu$m. According to the invention, since the buffer layer can have a relatively large average thickness, it can be produced simply. Moreover, since the aluminum nitride single crystal layer formed on the buffer layer can also have a large thickness, it is possible to realize a substrate for a surface acoustic wave device having an electromechanical coupling coefficient $K^2$ of about 0.8% and a TCF at a center frequency of about –20 pm/° C.

It should be noted that according to the invention, the buffer layer consisting of an aluminum nitride film or an aluminum-gallium nitride film is not formed on the sapphire single crystal substrate to be smooth, but has protrusions and depressions. In areas where the buffer layer has a small thickness, on the sapphire substrate surface, there are formed areas in which no aluminum nitride or aluminum-gallium nitride is present. Thus, a surface of the aluminum nitride single crystal layer formed on the buffer layer has also protrusions and depressions. Therefore, a thickness of the buffer layer having protrusions and depressions is represented as an average thickness. Furthermore, it should be noted that an average thickness of the aluminum nitride single crystal layer is an average thickness after polishing the surface thereof. Prior to the polishing, the aluminum nitride single crystal layer has an average thickness not less than 3 $\mu$m.

According to the invention, a method of manufacturing a substrate for use in a surface acoustic wave device comprises the steps of:

preparing a sapphire single crystal substrate made of $\alpha$-$Al_2O_3$ and having an off-angled surface which is obtained by rotating an R(1-102) surface about [11-20] axis by a given off-angle;

depositing by MOCVD, on said off-angled surface of the sapphire single crystal substrate, a buffer layer made of a material selected from the group consisting of aluminum nitride and aluminum-gallium nitride; and depositing, on said buffer layer, an aluminum nitride single crystal layer by MOCVD.

In a preferable embodiment of the method according to a further aspect of the invention, the off-angled surface of the sapphire single crystal substrate is obtained by rotating the R(1-102) surface about the [11-20] axis by an off-angle not less than about –2°. The buffer layer consisting of aluminum nitride or aluminum-gallium nitride is then deposited by MOCVD. Finally the aluminum nitride single crystal layer is deposited on the buffer layer by MOCVD.

In the method according to the invention, the buffer layer and aluminum nitride single crystal layer may be deposited by MOCVD, while the sapphire single crystal substrate is heated to a temperature not lower than 900° C. Upon comparison to the known process in which the buffer layer is deposited at a lower temperature, the method according to the invention is simple.

Moreover, according to the invention, prior to the deposition of the buffer layer by MOCVD, an initial nitriding treatment may be conducted after hydrogen annealing. By performing such an initial nitriding treatment, a very thin aluminum nitride single crystal film having a thickness not larger than 100 A is formed on the sapphire single crystal substrate surface. The above mentioned buffer layer is then formed on this aluminum nitride single crystal film.

BRIEF DESCRIPTION OF THE DRAWINGS

FIG. 4 is a schematic perspective view showing the R(1-102) surface of a sapphire single crystal substrate and the (1-210) surface of an aluminum nitride single crystal layer;

FIG. 7 is a graph showing a change in a surface temperature of the sapphire single crystal substrate during the MOCVD in the method according to the invention;

DESCRIPTION OF THE PREFERRED EMBODIMENTS

Figure 1:
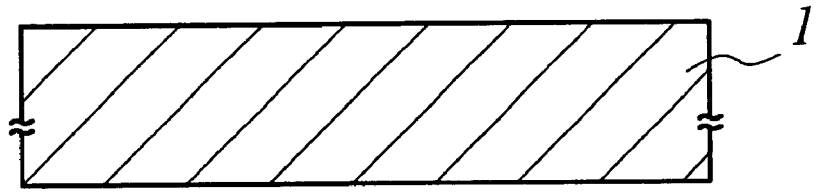
FIG. 1 is a cross sectional view showing a first step of the method of manufacturing the substrate for use in a surface acoustic wave device according to the invention.
Figure 2:
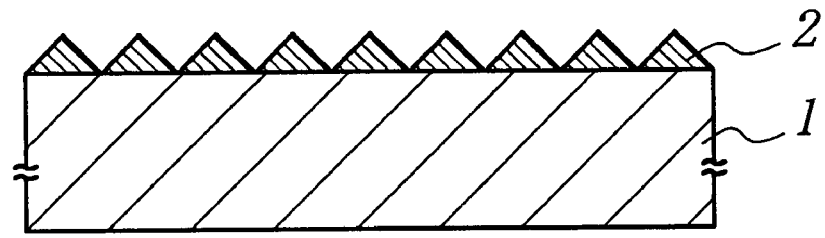
FIG. 2 is a cross sectional view depicting a next step.
Figure 3:
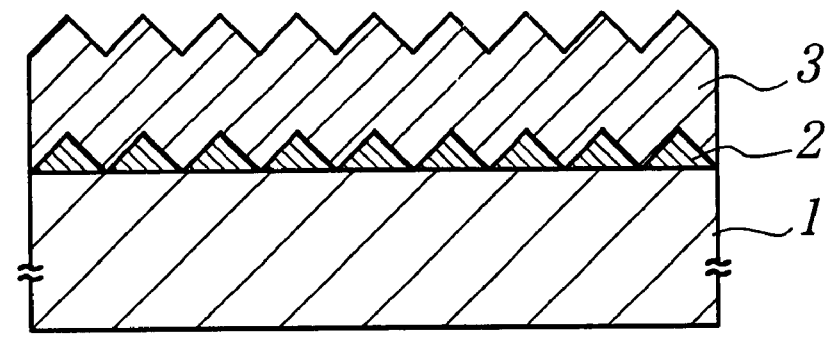
FIG. 3 is a cross sectional view illustrating a next step.

FIGS. 1–3 are cross sectional views showing successive steps of an embodiment of the method of manufacturing the substrate for a surface acoustic wave device according to the invention.

At first, as illustrated in FIG. 1, a sapphire single crystal wafer 1 expressed by a composition of $\alpha$-$Al_2O_3$ is prepared. The sapphire single crystal wafer 1 has a diameter of two inches and a thickness of about 450 $\mu$m. In the present invention, an aluminum nitride or aluminum-gallium nitride buffer layer is deposited on the sapphire wafer 1. An aluminum nitride single crystal layer is then deposited on the buffer layer. The sapphire single crystal substrate 1 has an off-angled surface obtained by rotating an R(1-102) surface about a [11-20] axis by a given off-angle.

FIG. 4 shows the R(1-102) surface as well as the [11-20] axis of the sapphire wafer 1, [11-20] axis being denoted by an a-axis. As stated above, according to the invention, the R(1-102) surface of the sapphire single crystal wafer is rotated about the a-axis. In this case, the rotation may be performed in both directions, i.e. positive and negative directions as shown by the arrows in FIG. 4.

Figure 5:
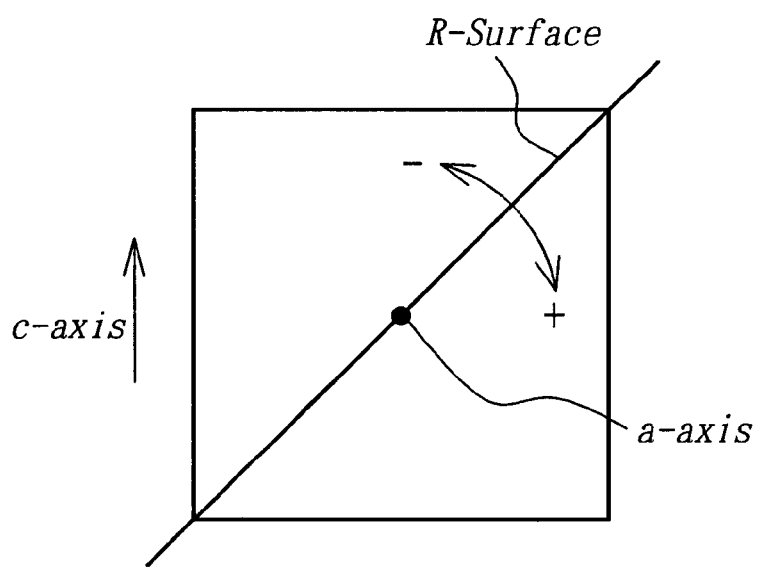
FIG. 5 is a schematic view representing a direction of rotation of the R(1-102) surface of the sapphire substrate about the a-axis to perform the off-angle.
Figure 6A:
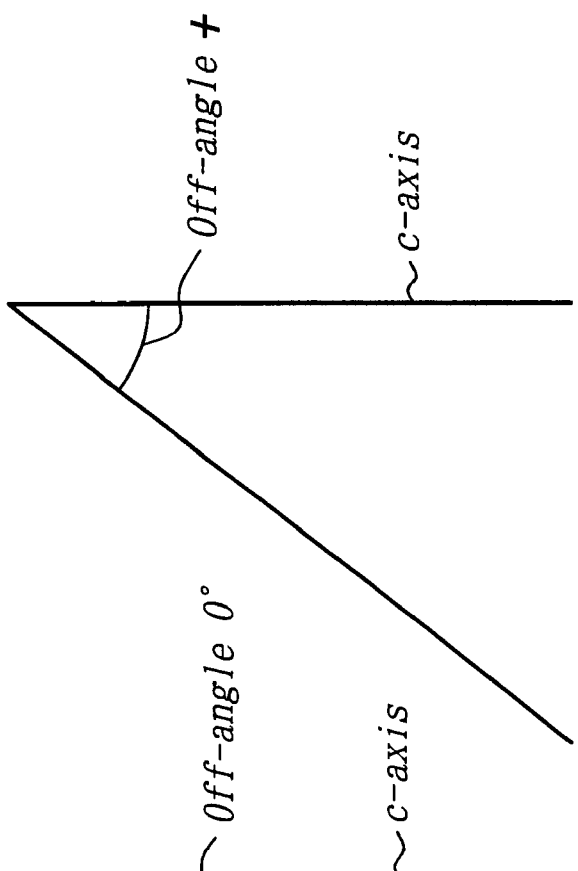
FIGS. 6A, 6B and 6C are schematic views explaining a relationship between the R-surface and the c-axis when the R-surface is rotated about the a-axis.
Figure 6B:
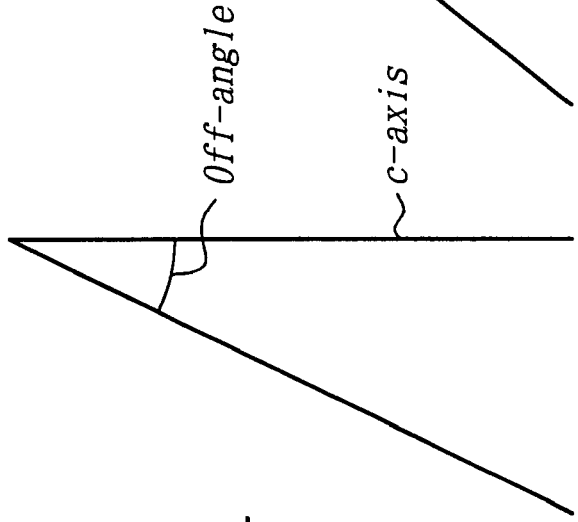
Figure 6C:
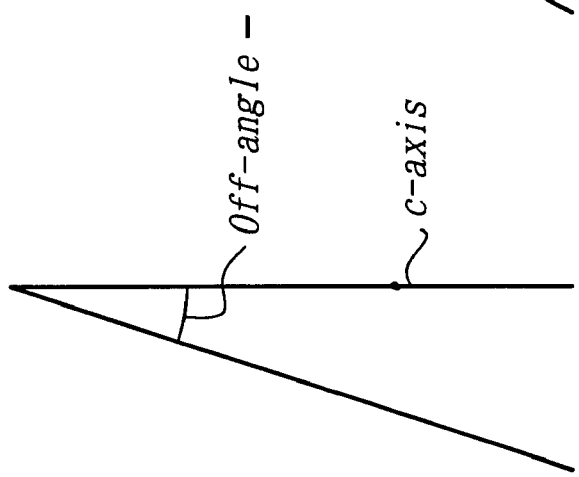

FIG. 5 is a schematic view for defining the direction of the rotation of the R-surface about the a-axis. Here, a rotation in the clockwise direction is denoted as + direction and a rotation in the anti-clockwise direction is denoted as − direction. In FIG. 5, there is also shown a c-axis. An angle between the c-axis and the R-surface is shown in FIGS. 6A–6C. While FIG. 6B illustrates a case of no or zero off-angle, FIG. 6A shows a case in which the R-surface is rotated in the − direction. FIG. 6C depicts a case in which the R-surface is rotated in the + direction. According to the invention, the R-surface is rotated in − direction to suppress effectively the generation of cracks.

As shown in FIG. 2, a buffer layer 2 consisting of a gallium nitride film is deposited on the off-angled surface of the sapphire single crystal wafer 1 by the metal organic chemical vapor deposition (MOCVD). The off-angled surface of the sapphire surface is obtained by rotating the R-surface about the a-axis in the −direction.

As stated above, there are formed protrusions and depressions in a surface of the gallium nitride film 2, so that when its thickness is small, there are formed areas at which no gallium nitride is deposited. Therefore, a thickness of such a gallium nitride film 2 is expressed by an average thickness.

In the present embodiment, the buffer layer 2 consisting of the gallium nitride film has an average thickness of 0.13 $\mu$m. According to the invention, the gallium nitride layer 2 has preferably an average thickness not less than 0.1 $\mu$m in order to suppress the formation of cracks.

Next, as depicted in FIG. 3, an aluminum nitride single crystal layer 3 is deposited on the gallium nitride layer 2 also by MOCVD. In this manner, according to the invention, on the surface of the sapphire single crystal substrate 1, is first deposited the gallium nitride layer 2, and then the aluminum nitride single crystal layer 3 is deposited on the gallium nitride layer 2.

As explained above, in the surface of the aluminum nitride single crystal layer 3, there are also formed protrusions and depression corresponding to those formed in the surface of the gallium nitride buffer layer 2. Therefore, electrodes of a surface acoustic wave device could not be formed on such a surface of the aluminum nitride single crystal layer 3. Accordingly, the surface of the aluminum nitride single crystal layer 3 is polished into a smooth surface. A thickness of the thus polished aluminum nitride layer 3 is expressed as an average thickness.

As explained above, the surface of aluminum nitride single crystal layer 3 formed on the off-angled surface of the sapphire single crystal substrate 1 is the R(1-210) rotated by an angle corresponding to the off-angle. In FIG. 4, this (1-210) surface of the aluminum nitride single crystal layer 3 is also shown.

In the present embodiment, the aluminum nitride single crystal layer 3 has an average thickness of about 2.3 $\mu$m. According to the invention, in order to attain a desired surface acoustic wave property, it is preferable that an average thickness of the aluminum nitride single crystal layer 3 is not less than about 2 $\mu$m.

After depositing the gallium nitride layer 2 and the aluminum nitride single crystal layer 3 successively by MOCVD, a desired interdigital type electrode pattern is formed on the aluminum nitride single crystal layer 3 with the aid of a conventional method. Then, the sapphire single crystal wafer 1 having the layers 2 and 3 and the interdigital electrode patter formed thereon is divided into chips by a conventional slicing technique. The obtained chips are then placed in packages, given conducting wires that are secured to electrodes, and finally the packages are sealed in an air-tight manner. In this manner, a surface acoustic wave device can be obtained on a mass production scale.

Now an example of depositing the gallium nitride layer 2 and aluminum nitride single crystal layer 3 will be explained.

As shown in FIG. 7, at first, the sapphire single crystal wafer 1 having the off-angled surface is introduced into a CVD apparatus and then is heated to a temperature of about 1000° C. A hydrogen gas is then introduced into the CVD apparatus to subject the sapphire wafer 1 to the hydrogen annealing for about thirty minutes. During the deposition of the layers, the CVD apparatus is maintained at a pressure of about 15 Torrs. Next, the temperature of the sapphire single crystal wafer 1 is decreased to about 950° C., at which time an initial nitriding treatment is performed by introducing an ammonia (NH3) gas at a flow rate of 1–5 liters/min for about ten minutes into the CVD apparatus together with a carrier gas consisting of hydrogen or nitrogen. During this initial nitriding treatment, on the surface of the sapphire single crystal substrate 1 is formed a very thin AlNO film having an average thickness of about several tens microns. This thin film is not shown in FIG. 2.

Then, a trimethylgallium (TMG) gas and an ammonia gas are introduced into the CVD apparatus at flow rates of about 25 μmole/min and about 2 liters/min, respectively for about ten minutes to deposit gallium nitride to form the gallium nitride layer 2 having an average thickness of about 0.13 μm. After that, a trimethylaluminum (TMA) gas and an ammonia gas are introduced into the CVD apparatus for one hundred and twenty minutes at flow rates of 30 μmole/min and 1–5 liters/min, respectively to deposit the aluminum nitride single crystal layer 3 with an average thickness of about 2.3 μm. Lastly, only the hydrogen carrier gas is supplied and the sapphire single crystal substrate 1 is gradually cooled down to the room temperature.

In the manner explained above, according the invention, the gallium nitride buffer layer 2 and the aluminum nitride single crystal layer 3 can be successively deposited without removing the sapphire wafer 1 from the CVD apparatus, and moreover since the sapphire single crystal substrate is kept to a constant temperature, the manufacturing process is very simple.

Figure 8:
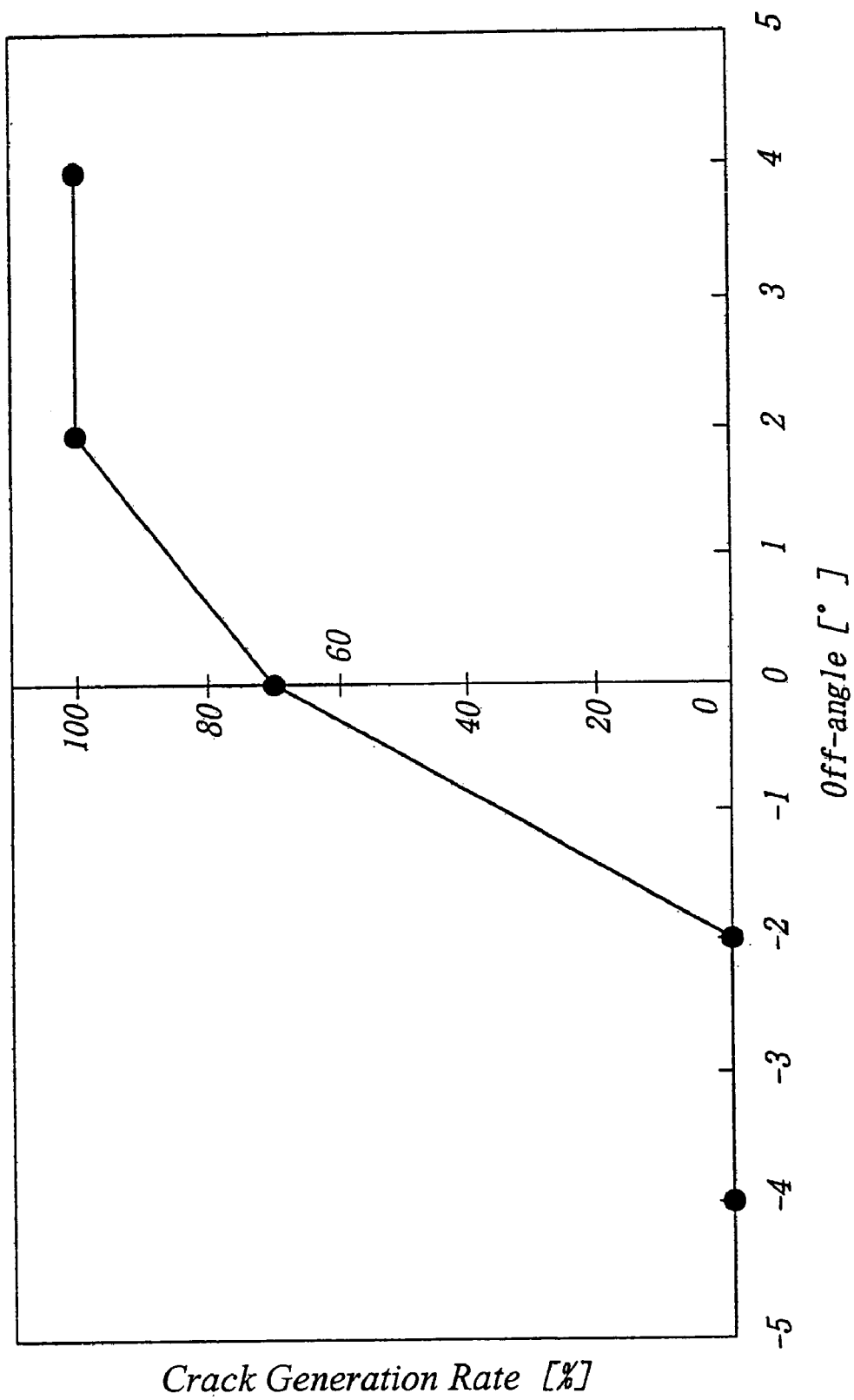
FIG. 8 is a graph showing a relationship between a rotation angle of the R surface of the sapphire single crystal substrate about the a-axis and a crack generation rate.

According to the invention, use is made of the sapphire single crystal substrate or wafer 1 having the off-angled surface which is obtained by rotating the R(1-102) surface about the [11-20] axis by a given off-angle. Now a relationship between the off-angle and the generation of cracks will be explained. In a graph shown in FIG. 8, the rotation angle of the R(1-102) about the [11-20] axis is denoted on the horizontal axis, and the crack generation rate is represented on the vertical axis. The off-angle is changed within a range from +4° to −4°. As can be understood from FIG. 8, when the off-angle is zero, i.e. when the R-surface is not rotated, the crack generation rate amounts to a large value about 70%. The crack generation rate is further increased when the R-surface is rotated in the + direction. However, when the R-surface is rotated in the − direction, the crack generation rate is decreased abruptly. When the − rotation exceeds 2°, the crack generation rate becomes substantially zero.

Figure 9:
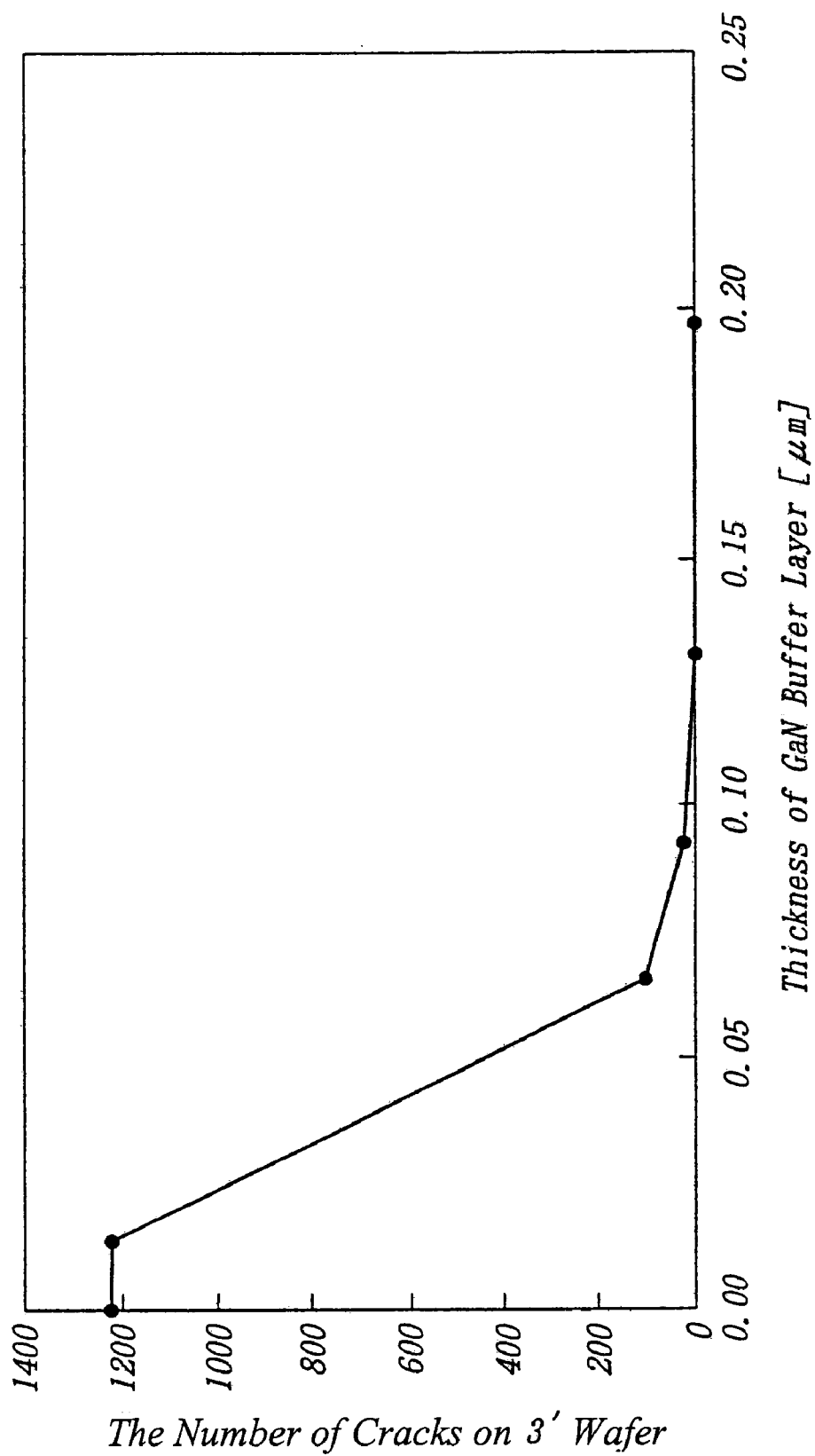
FIG. 9 is a graph showing a relationship between an average thickness of the gallium nitride buffer layer and a generation of cracks.

FIG. 9 is a graph showing a variation of the crack generation rate when an average thickness of the gallium nitride buffer layer 2 is changed. The gallium nitride buffer layer 2 is formed on the sapphire single crystal substrate 1 having the off-angle of −40°, and the aluminum nitride single crystal layer 3 having an average thickness of 2 μm is deposited. The crack generation rate is evaluated by the number of cracks induced in a three inch wafer.

As can be seen from FIG. 9, when an average thickness of the gallium nitride buffer layer 2 is smaller than 0.1 μm, a large number of cracks are induced. When an average thickness of the gallium nitride buffer layer 2 is larger than 0.1 μm, the generation of cracks is extremely suppressed. When an average thickness of the gallium nitride buffer layer 2 is larger than 0.2 μm, there is no remarkable change in the reduction of the crack generation rate. Therefore, it is preferable that the gallium nitride buffer layer have an average thickness of 0.1–0.2 μm.

Figure 10:
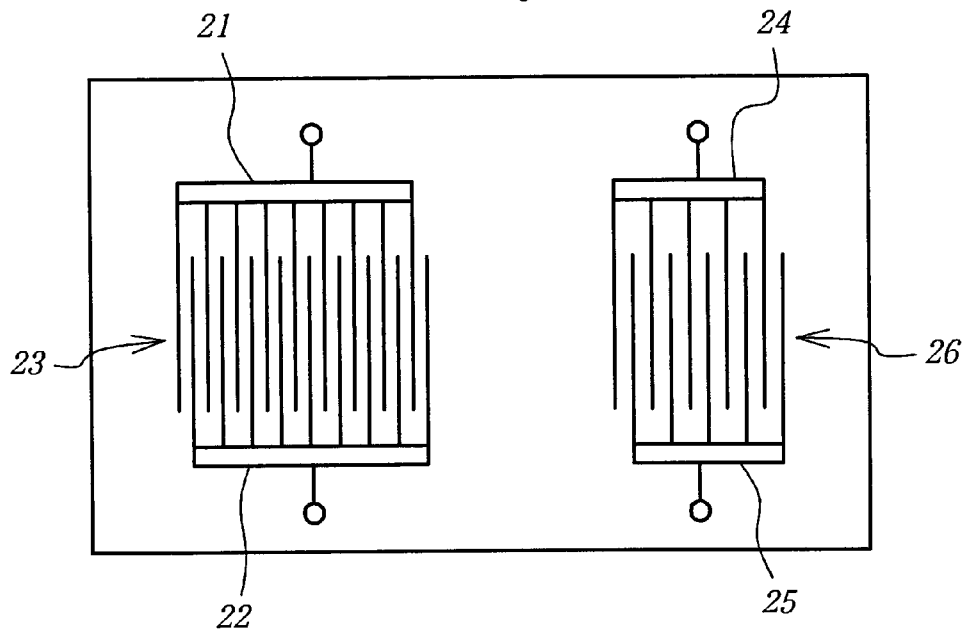
FIG. 10 is a schematic plan view illustrating an embodiment of the surface acoustic wave device comprising the substrate according to the invention.

FIG. 10 is a plan view showing an embodiment of the surface acoustic wave device according to the invention comprising the substrate explained above. In the present embodiment, the surface acoustic wave device is formed as a surface acoustic wave filter, which comprises a sapphire single crystal substrate, a gallium nitride buffer layer deposited on the sapphire substrate with an average thickness of 0.1 μm and an aluminum nitride single crystal layer deposited on buffer layer with an average thickness of 2.3 μm. An electrode structure is deposited on the aluminum nitride single crystal layer. In the present embodiment, an input side transducer 23 is formed by regular type interdigital electrodes 21 and 22 whose adjacent electrode fingers are interdigitally crossed. An output side transducer 26 is arranged to be separated from the input side transducer 23 by a predetermined distance. The output side transducer is also formed by regular type interdigital electrodes 24 and 25 whose adjacent electrode fingers are crossed with each other in an interdigital manner. The aluminum nitride single crystal layer on which the electrodes are deposited has a very high propagating velocity for a surface acoustic wave not lower than 5000 m/sec, and thus by suitably setting widths of electrode fingers and distances between adjacent electrode fingers, it is possible to realize the surface acoustic wave filter having a very high operation frequency of an order of GHz.

Figure 11:
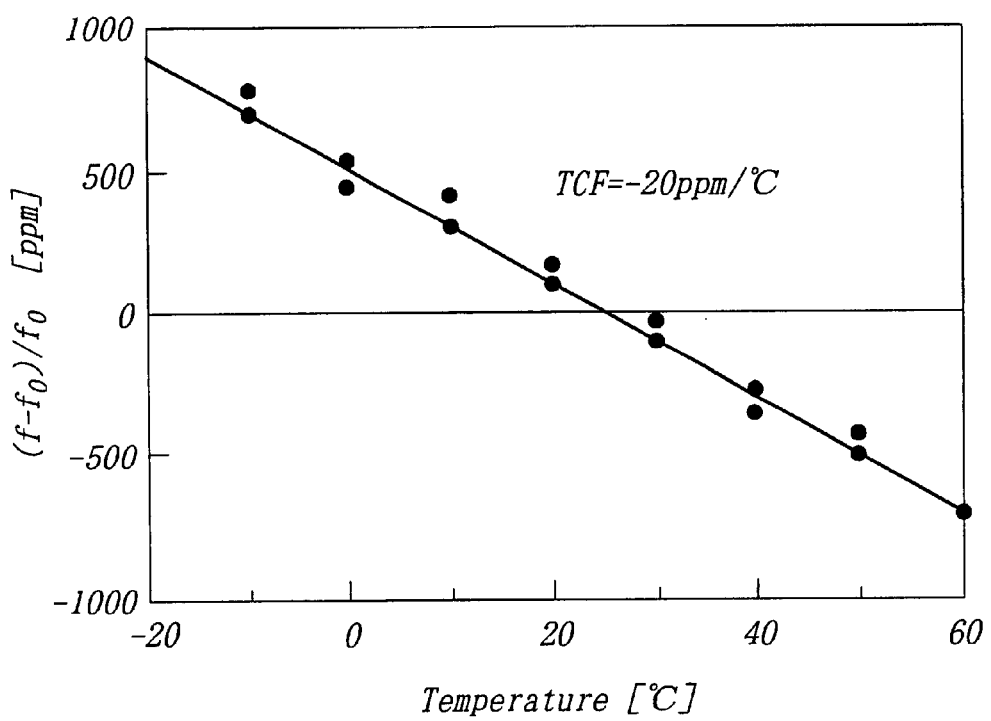
FIG. 11 is a graph representing a temperature coefficient of a center frequency of the substrate according to the invention.

FIG. 11 is a graph showing TCF (Temperature Coefficient of Frequency) at a center frequency of the surface acoustic wave device shown in FIG. 10. In this embodiment, a designed center frequency is 2500 MHz and a wavelength λ is 2.25 μm. TCF is theoretically expressed by $(f-f_0)/f_0$(ppm), where $f_0$ is the center frequency. As can be understood from this graph, the surface acoustic wave device according to the invention can have TCF of −20 ppm/° C., which is close to a theoretical value.

The present invention is not limited to the embodiments explained above, but many alternations and modifications may be conceived by those skilled in the art within the scope of the invention.

For instance, in the above embodiment, the buffer layer is consisting of a gallium nitride layer, but it may consist of an aluminum-gallium nitride (Al—Ga—N) layer. In this case, a composition ratio between aluminum and gallium may be adjusted over a wide range by controlling flow rates of $NH_3$, TMG and TMA during the MOCVD process. Further, the composition of the aluminum-gallium nitride buffer layer may be changed in a direction of a thickness. For instance, a flow rate of TMG is gradually increased and at the same time a flow rate of TMA is gradually decreased. The effects obtained by the above embodiment can be equally obtained by using the aluminum-gallium (Al—Ga—N) nitride as the buffer layer.

Furthermore, in the above embodiment, use is made of the sapphire single crystal wafer having a diameter of three inches, but according to the invention a sapphire single crystal wafer having a diameter which is smaller or larger than three inches may be used. As stated above, the advantages of the present invention can be attained effectively when using a large sapphire single crystal wafer, it is preferable to use a sapphire single crystal wafer having a diameter not less than two inches.

Moreover, in the above embodiment, the surface acoustic wave device according to the invention is realized as the surface acoustic wave filter having the regular type interdigital electrodes, but the surface acoustic wave filter may comprise any other type of electrodes or weighted electrodes. Further, the surface acoustic wave device may be realized as surface acoustic wave resonator or delay line.

As explained above in detail, according to the invention, it is possible to provide the aluminum nitride single crystal layer which has no crack, a sufficiently high electromechanical coupling coefficient $K^2$, a sufficiently small TCF at the center frequency, and a high propagating velocity for the surface acoustic wave even when a sapphire single crystal wafer of not less than two inches is used. Therefore, surface acoustic wave devices having excellent properties and an extremely high operation frequency can be realized at a low cost. Moreover, the buffer layer can have a sufficiently large average thickness which can be controlled easily and accurately, and the deposition of the buffer layer can be performed at a high temperature. Therefore, the manufacturing process can be simplified and the manufacturing cost can be reduced.

What is claimed is:

1. A substrate for use in a surface acoustic wave device comprising a sapphire single crystal substrate made of $\alpha\text{-Al}_2\text{O}_3$, a buffer layer formed on the sapphire single crystal substrate, said buffer layer being made of a material selected from the group consisting of gallium nitride and aluminum-gallium nitride, and an aluminum nitride single crystal layer formed directly on said buffer layer with an average thickness larger than that of the buffer layer.

2. The substrate according to claim 1, wherein said buffer layer is formed on an off-angled surface of the sapphire single crystal substrate obtained by rotating an so R(1-102) surface about a [11-20] axis by a given off-angle.

3. The substrate according to claim 2, wherein said off-angled surface is formed by rotating the R(1-102) surface about the [11-20] axis in a negative direction.

4. The substrate according to claim 3, wherein said off-angled surface is formed by rotating the R(1-102) surface about [11-20] axis in the negative direction by an off-angle not less than about 2°.

5. The substrate according to claim 1, wherein said buffer layer has an average thickness of substantially 0.1–0.2 μm.

6. The substrate according to claim 1, wherein said aluminum nitride single crystal layer deposited on the buffer layer has an average thickness not less that about 2 μm.

7. The substrate according to claim 1, wherein said buffer layer consists of an aluminum-gallium nitride layer having a varied composition.

8. The substrate according to claim 7, wherein a composition of said buffer layer consisting of aluminum-gallium nitride layer is gradually varied in a direction of thickness.

9. The substrate according to claim 1, wherein said substrate has an electromechanical coupling coefficient $K^2$ of about 0.8% and a temperature coefficient of frequency of about −20 ppm/° C. at a center frequency.

10. The substrate according to claim 1, wherein said aluminum nitride single crystal layer has a polished surface.

11. The substrate according to claim 1, wherein said sapphire single crystal substrate is formed by a wafer having a diameter not less than two inches.

12. A surface acoustic wave device comprising:

a sapphire single crystal substrate made of $\alpha\text{-Al}_2\text{O}_3$;

a buffer layer formed on the sapphire single crystal substrate, said buffer layer being made of a material selected from the group consisting of gallium nitride and aluminum-gallium nitride;

an aluminum nitride single crystal layer formed directly on said buffer layer with an average thickness larger than that of the buffer layer; and an interdigital electrode structure formed on said aluminum nitride single crystal layer.

13. The device according to claim 12, wherein said buffer layer is formed on an off-angled surface of the sapphire single crystal substrate obtained by rotating an R(1-102) surface about a [11-20] axis in a negative direction by a given off-angle.

14. The device according to claim 13, wherein said off-angled surface is formed by rotating the R(1-102) surface about the [11-20] axis in a negative direction by an off-angle not less than about 2°.

15. The device according to claim 1, wherein said buffer layer has an average thickness of substantially 0.1–0.2 μm, and said aluminum nitride single crystal layer deposited on the buffer layer has an average thickness not less that about 2 μm.

16. The device according to claim 15, wherein said interdigital electrode structure is formed on a polished surface of said aluminum nitride single crystal layer.

17. The device according to claim 12, wherein said substrate has an electromechanical coupling coefficient $K^2$ of about 0.8%, a temperature coefficient of frequency of about −20 ppm/° C. at a center frequency, and a surface acoustic wave propagating velocity higher than 5000 m/sec.

18. The device according to claim 17, wherein said interdigital electrode structure is formed such that the surface acoustic device operates at an operation frequency not lower than 1 GHz.

19. A substrate for use in a surface acoustic wave device comprising a sapphire single crystal substrate made of $\alpha\text{-Al}_2\text{O}_3$, a single buffer layer formed on the sapphire single crystal substrate, said buffer layer being made of a material selected from the group consisting of gallium nitride and aluminum-gallium nitride, and an aluminum nitride single crystal layer formed directly on said buffer layer with an average thickness larger than that of the buffer layer.

* * * * *